(12) United States Patent
Tihanyi

(10) Patent No.: US 6,313,485 B1
(45) Date of Patent: Nov. 6, 2001

(54) GATE-CONTROLLED THYRISTOR

(75) Inventor: Jenoe Tihanyi, Kirchheim (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/281,690

(22) Filed: Mar. 30, 1999

Related U.S. Application Data

(63) Continuation of application No. PCT/DE98/02154, filed on Jul. 29, 1998.

(30) Foreign Application Priority Data

Jul. 30, 1997 (DE) ............................................. 197 32 912
Sep. 9, 1997 (DE) ............................................. 197 39 498

(51) Int. Cl.[7] ......................... H01L 29/74; H01L 29/745; H01L 29/735
(52) U.S. Cl. ......................... 257/140; 257/139; 257/141; 257/152; 257/156; 257/162
(58) Field of Search ................................... 257/138, 139, 257/152, 153, 156, 162, 141, 140

(56) References Cited

U.S. PATENT DOCUMENTS

| 4,007,474 | 2/1977 | Yagi et al. |
|---|---|---|
| 4,502,070 | 2/1985 | Leipold et al. |
| 4,982,258 | 1/1991 | Baliga . |
| 5,124,772 | * 6/1992 | Hideshima ............................ 257/139 |
| 5,162,876 | * 11/1992 | Kitagawa ............................ 257/138 |
| 5,262,336 | * 11/1993 | Pike ............................ 257/139 |
| 5,306,930 | * 4/1994 | Baliga ............................ 257/152 |
| 5,608,235 | * 3/1997 | Pezzani . |

FOREIGN PATENT DOCUMENTS

| 30 24 015 A1 | 1/1982 | (DE) . |
|---|---|---|
| 38 42 468 C2 | 6/1989 | (DE) . |
| 0 043 009 A2 | 1/1982 | (EP) . |
| 0433 825 A1 | 6/1991 | (EP) . |
| 6-188409 | * 7/1994 | (JP) ............................ 257/138 |

OTHER PUBLICATIONS

International Publication WO 93/05535 (Pike et al.), dated Mar. 18, 1993.
Noriyuki Iwamuro et al.: "1200 V MCCT: A New Concept Three Terminal MOS–Gated Thyristor", ISPSD 97, 1997, pp. 245–246.

* cited by examiner

*Primary Examiner*—Jerome Jackson, Jr.
(74) *Attorney, Agent, or Firm*—Herbert L. Lerner; Laurence A. Greenberg; Werner H. Stemer

(57) ABSTRACT

A gate-controlled thyristor in which an IGBT in a first cell and a thyristor in a main cell are connected together in ouch a way that the first cell and the main cell form a lateral FET with a channel of a first conducting type. In an emitter zone of the thyristor, there is a layer embedded that increases the charge carrier recombination in order to reduce the start-up resistance of the gate-controlled thyristor. Trenches, filled with insulated gate electrodes, can be introduced into the lateral FET, so that the FET is a side wall FET.

20 Claims, 4 Drawing Sheets

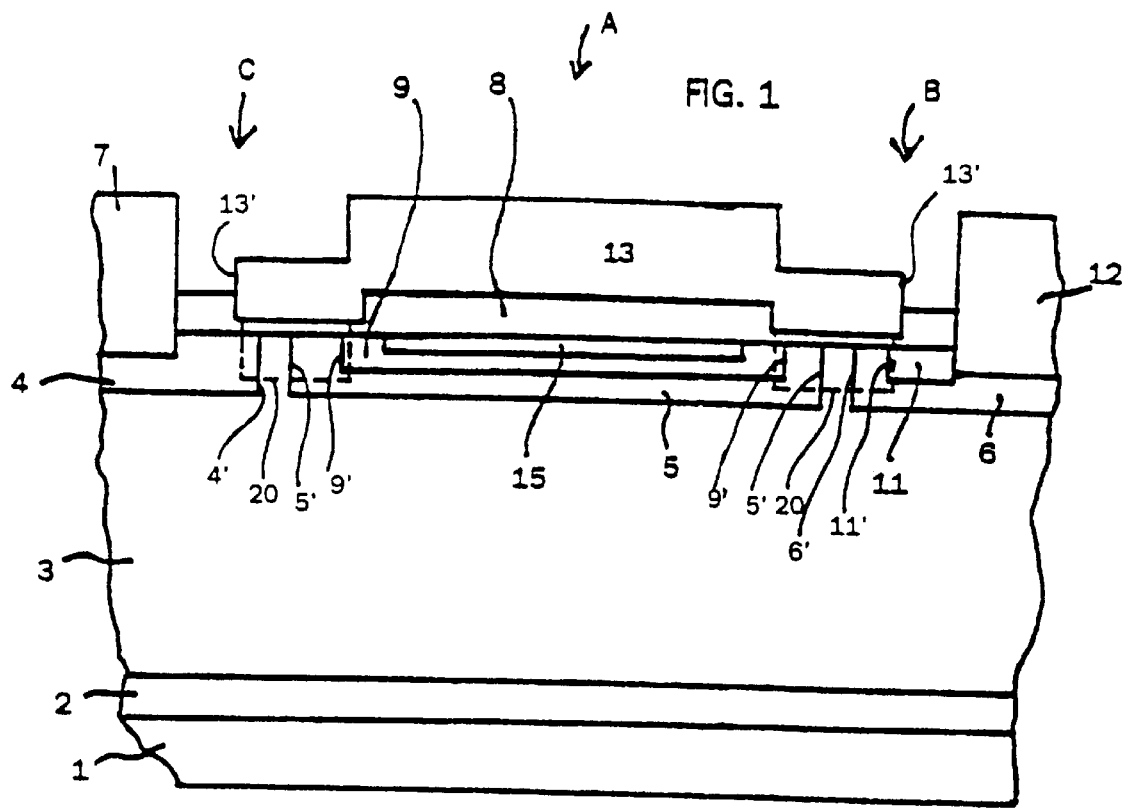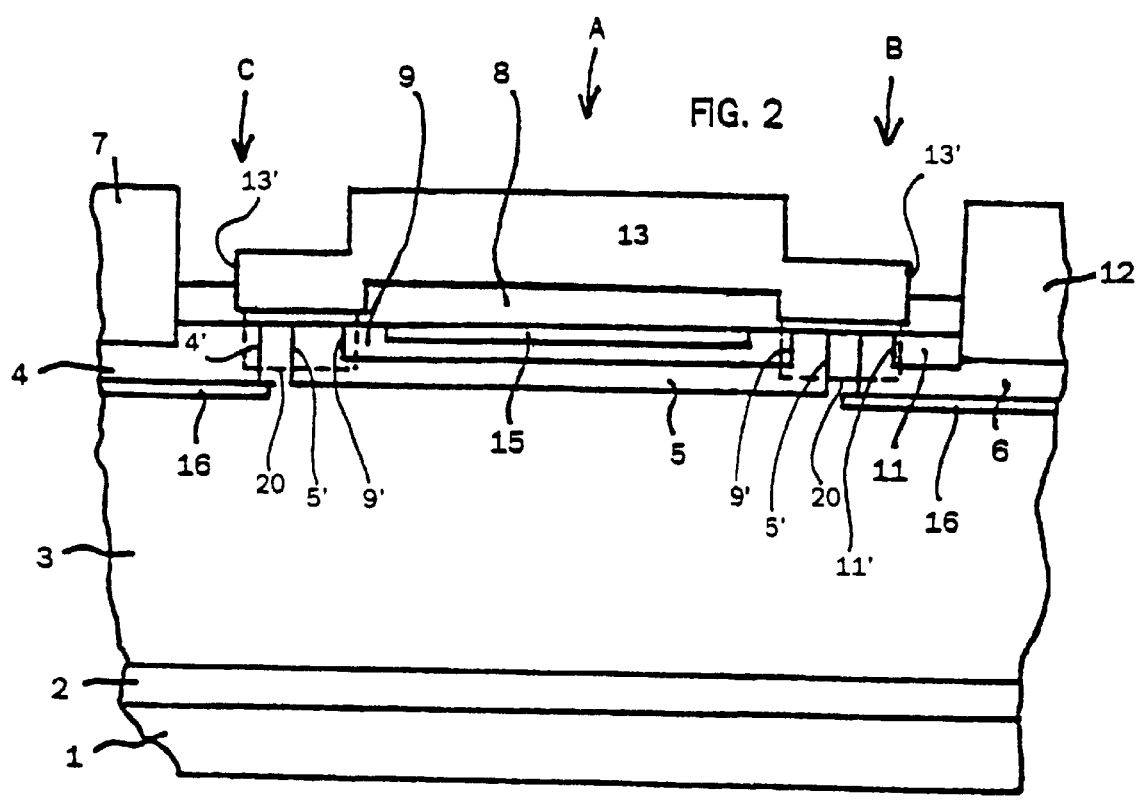

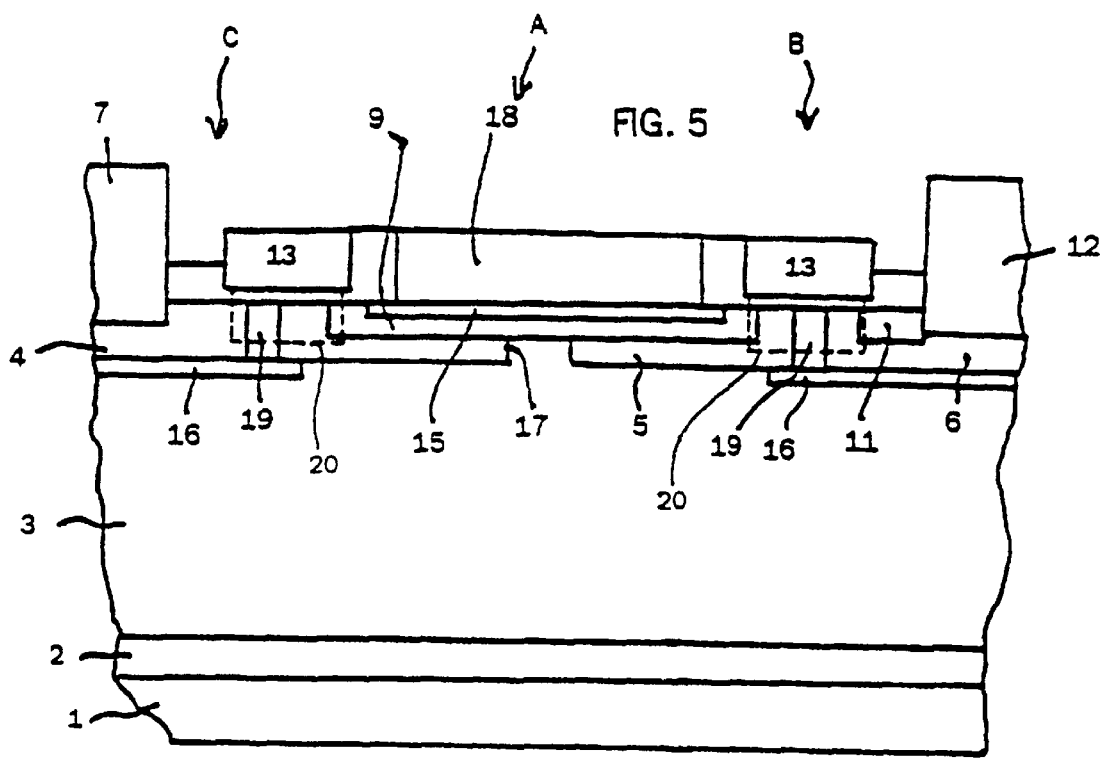
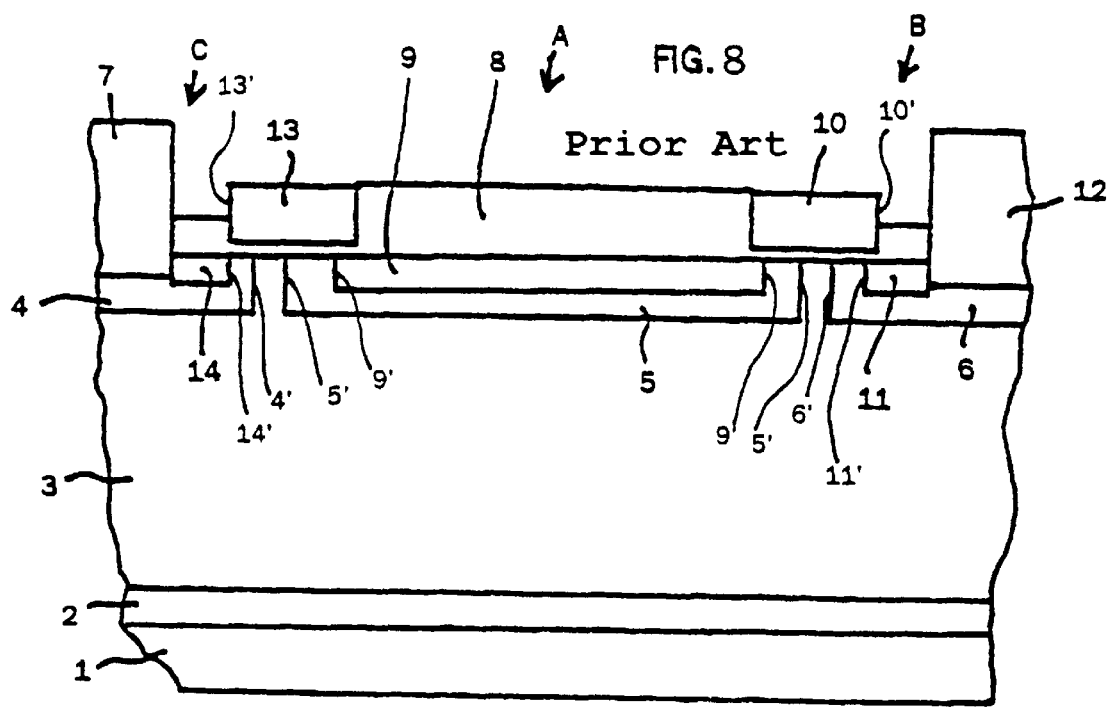

GATE-CONTROLLED THYRISTOR

CROSS-REFERENCE TO RELATED APPLICATION

This is a continuation of copending International Application PCT/DE98/02154, filed Jul. 29, 1998, which designated the United States.

BACKGROUND OF THE INVENTION

FIELD OF THE INVENTION

The present invention concerns a gate-controlled thyristor, such as a cascode-MOS thyristor in which an insulated gate bipolar transistor (IGBT) in a first cell and a thyristor in a main cell are connected together in such a way that the first cell and the main cell form a lateral FET with a channel of a first conductivity type.

Such a cascode MOS thyristor was already proposed many years ago in Published, Non-Prosecuted German Patent Application DE 30 24 015 A, corresponding to U.S. Pat. No. 4,502,070, and has recently been discussed again as a MOS controlled cascode thyristor (MCCT) (see the report "1200 V MCCT: A New Concept Three Terminal MOS-Gated Thyristor" by N. Iwamuro, T. Iwaana, Y. Harada and Y. Seki at the ISPSD 97 Conference). Such a cascode MOS thyristor, as well as general MOS-controlled bipolar structures, such as IGBTs and MOS Controlled Thyristors (MCTs), are preferred to MOSFETs because of their relatively low start-up resistance. As it is well known, generally speaking, switches should close at as high a voltage as possible, but when they are turned on or are conducting, they should have as low resistance as possible.

SUMMARY OF THE INVENTION

It is accordingly an object of the invention to provide a gate-controlled thyristor that overcomes the above-mentioned disadvantages of the prior art devices of this general type, which is characterized by an especially low start-up resistance.

With the foregoing and other objects in view there is provided, in accordance with the invention, a gate-controlled thyristor, including: a first cell having a insulated gate bi-polar transistor (IGBT); and a main cell having a thyristor with an emitter zone and a layer embedded in the emitter zone of the thyristor for increasing charge carrier recombination, the thyristor connected to the IGBT such that the first cell and the main cell form a lateral field effect transistor (FET) having a channel of a first conducting type.

In order to create a gate-controlled thyristor, which is characterized by an especially low start-up resistance, it is proposed that, in a cascode MOS thyristor of the type mentioned at the outset, an additional layer be embedded in the emitter zone of the transistor, which increases the current carrier recombination. The additional layer can consist of a metal or silicide, for example, aluminum, titanium silicide, etc. Besides, in addition to the main cell, a second cell may also be connected with a MOS switch, which forms with the main cell a FET with a channel of a second conductivity type.

In the case of a positive gate voltage (see FIG. 8), the thyristor cathode is grounded, so that the on-state DC resistance is extremely low. If zero volts or a negative gate voltage is applied, then the first cell is disconnected as a lateral and vertical FET (field-effect transistor), while the second cell conducts, for example, as a p-channel FET and no current flows.

The individual cells can be disposed next to one another in the striated form. It is also possible to dispose the first cell and the second cell concentrically around the main cell. The dimensions for the cells can be chosen arbitrarily, and it is also possible to provide only the first cell together with the main cell.

Optionally, an insulator layer can be disposed under the first cell and the second cell, which ensures better flooding, especially of the n-conducting base zone with charge carriers and as a result ensuring an even smaller start-up resistance. Optionally, the insulator layer can reach all the way to the p-conducting base zone of the thyristor or the main cell. In this case, when the insulator layer reaches the p-conducting base zone, an opening should be present in it in order to increase the effect of the IGBT.

An advantage of the present invention consists in the fact that a gate-controlled thyristor can be created, the FETs of which can be configured practically in any arbitrary way so that they can be adapted to the most varied applications.

For this purpose, at least one trench is made in the lateral FET where an insulated gate electrode is provided. Advantageously, at least one trench with a gate electrode is also applied in a FET of a second cell.

The gate-controlled thyristor according to the invention can be produced simply with the usual process procedures and is superior even to the existing cascode MOS thyristor with regard to conductivity, because they have a large channel surface formed by the side-wall FETs located in the trenches.

Other features which are considered as characteristic for the invention are set forth in the appended claims.

Although the invention is illustrated and described herein as embodied in a gate-controlled thyristor, it is nevertheless not intended to be limited to the details shown, since various modifications and structural changes may be made therein without departing from the spirit of the invention and within the scope and range of equivalents of the claims.

The Construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a sectional view through a first embodiment of a thyristor according to the invention;

FIG. 2 is a sectional view through a second embodiment of the thyristor;

FIG. 5 is a sectional view through a fourth embodiment of the thyristor;

FIG. 8 is a sectional view through a prior art cascode MOS thyristor.

DESCRIPTION OF THE PREFERRED EMBODIMENTS

Figure 3:
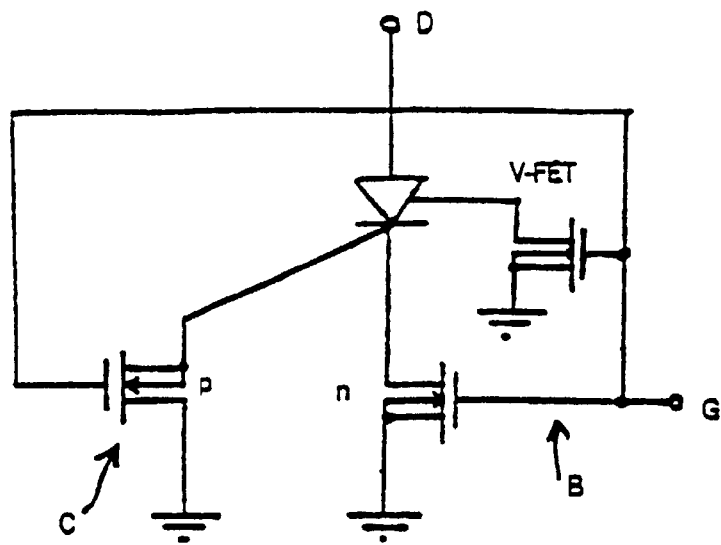
FIG. 3 is a schematic diagram of an equivalent circuit for the thyristor.

In all the figures of the drawing, sub-features and integral parts that correspond to one another bear the same reference symbol in each case. Referring now to the figures of the drawing in detail and first, particularly, to FIG. 8 thereof, there is shown a prior art cascode MOS thyristor as the state of the art with a main cell A, a first cell B and a second cell C, where cells B and C are disposed striated on the two sides of cell A. The main cell A has an anode electrode 1, a p- (or $p^+$-) conducting zone 2, an n-conducting base zone 3, a p-conducting base zone 5 with an edge 5' and an n-conducting emitter zone 9 with an edge 9'. An insulating layer 8, for example, consisting of silicon dioxide is disposed on the emitter zone 9.

The first cell B has a gate contact 10 with an edge 10' made of polysilicon, an $n^+$-conducting zone 11 with an edge 11', a p-conducting zone 6 with an edge 6' and a contact 12 and forms a first IGBT.

The second cell C has a gate contact 13 with an edge 13' made of polycrystalline silicon, an $n^+$-doped zone 14 with an edge 14', a p-doped zone 4 with an edge 4' and a contact 7 made, for example, of aluminum, and forms a second IGBT.

Thus, in the cascode MOS thyristor, the IGBTs are contacted with the cathode electrode, while the thyristor has a channel zone, but no cathode contact. The current is controlled by applying a gate voltage at the gate contacts 10 or 13, in order to open both the channel zone of the thyristor as well as the channel zone of the IGBT. The start-up resistance of the cascode MOS thyristor is relatively low, but after turning off the gate voltage, it is able to maintain a high voltage.

A first embodiment according to the invention is shown in FIG. 1. FIG. 1 shows a first practical example of the present invention starting with the gate-controlled thyristor, which has a very small start-up resistance. For this purpose, in the n-conducting emitter zone 9, a layer 15 made of a metal or silicide, for example, aluminum or titanium silicide, is disposed to increase the charge carrier recombination. Optionally, other silicides or other general materials can be chosen for this, which would increase the recombination rate of the charge carriers.

Moreover, the gate-controlled thyristor is constructed similarly to the thyristor of FIG. 8, but the IGBT in the second cell C has no $n^+$-doped zone 14, so that here the edge 14' is also omitted.

Thus, the cell B is a normal IGBT source cell with the $n^+$-doped zone 11 in which there is a p-doped zone 6 forming a trough. As already explained, the second cell C has no $n^+$-doped zone in the p-doped zone 4.

The first cell B and the main cell A thus form an n-channel lateral FET, while the second cell C and the main cell A represent a p-channel FET.

The n-conducting base zone 3, which was grown by epitaxy, and/or the entire structure can be doped entirely or partially with gold, platinum or by crystal defects produced by irradiation for defining a limited lifetime.

Figure 6:
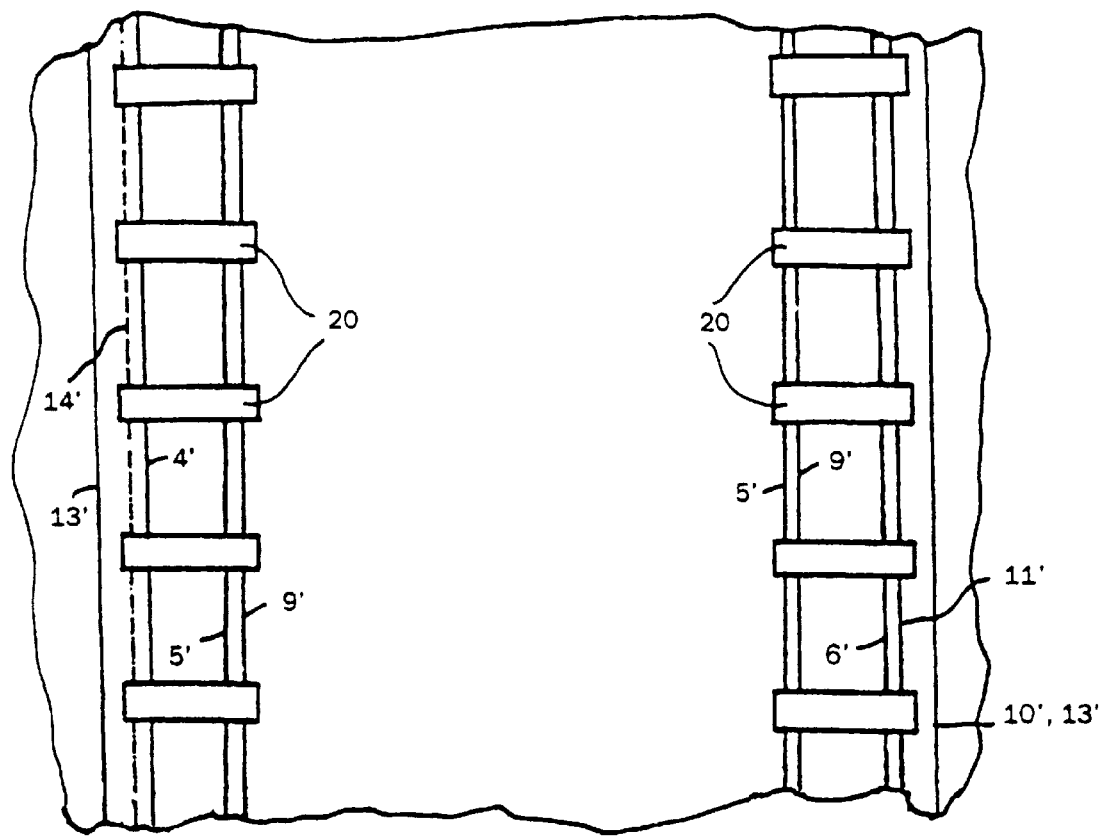
FIG. 6 is a top plan view of a trench structure.
Figure 7:
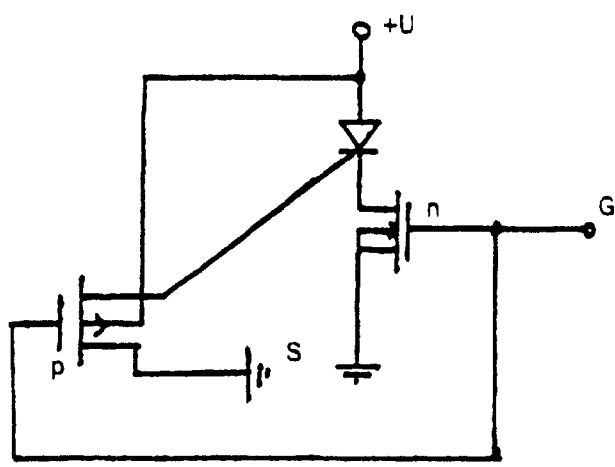
FIG. 7 is a schematic diagram of a simplified circuit principle of two FETs of the thyristor.

According to the invention, trenches 20 filled with insulated gate electrodes are introduced into the lateral FETs, as it can be seen in the top view shown in FIG. 6. The trenches 20, which are disposed at a distance from one another perpendicularly to the plane of the drawing in FIG. 1, can allow practically any arbitrary form of the two FETs (see FIG. 7) and ensure a large channel surface. It should be pointed out that the edge 14' (shown with the dashed line in FIG. 6) is present only when, in addition, the layer 14 is introduced into the layer 4 as shown in FIG. 8.

In a second embodiment of the invention, below the two cells B and C, that is, below the p-conducting zones 6 and 4, an insulator layer 16 can be provided but this does not reach all the way to the p-conducting base zone 5, as it is shown in FIG. 2. The insulator layer 16 ensures an even better "flooding" of the n-conducting zone 3 with charge carriers, which reduces the start-up resistance even more. The "tick-marked" reference numbers for the particular edges are partially omitted in FIGS. 4 and 5 for better clarity.

Figure 4:
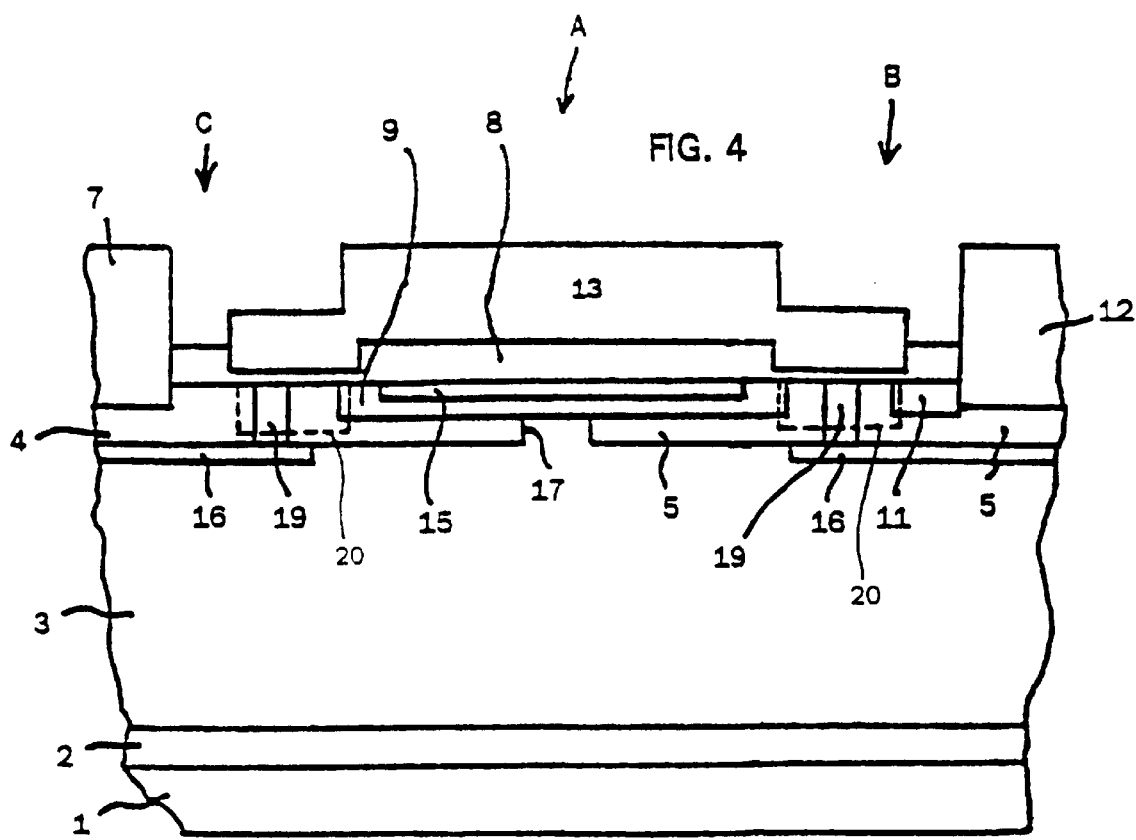
FIG. 4 is a sectional view through a third embodiment of the thyristor.

In a third embodiment of the invention, which is shown in FIG. 4, the insulator layers 16 can reach all the way up to the p-conducting base zone 5 and sometimes even cover this partially. However, in this case, an opening 17 must be present in the p-base zone 5 in order to reach the IGBT action of the main cell A. So-called intermediate zones 19 are doped relatively weakly and are either n or p-conducting.

FIG. 5 shows a fourth embodiment of the gate-controlled thyristor according to the invention, in which a metal layer 18 is provided above the $n^+$-conducting emitter zone 9 on the layer 15.

An equivalent circuit for the gate-controlled thyristor of the above practical examples is shown in FIG. 3. With a positive gate voltage at the gate G, the thyristor cathode is grounded so that the on-state DC resistance is low. However, if 0 V or a negative voltage is applied to the gate G, then the first cell B is turned off as a lateral and vertical FET, while the second cell C conducts as a p-channel FET and no current flows.

The trenches 20 are "filled" in the usual manner with an insulated gate electrode for which suitable materials (for example, polysilicon as gate electrode, $SiO_2$ as gate insulator, etc.) can be used. As a result of this, the side wall of the trench 20 acts as a channel area of a MOSFET.

Thus, the invention makes it possible to produce a gate-controlled thyristor that has an extremely low start-up resistance and yet is able to maintain high voltages.

I claim:

1. A gate-controlled thyristor, comprising:
   a first cell having an insulated gate bi-polar transistor (IGBT);
   a main cell having a thyristor with an emitter zone and a layer embedded in said emitter zone of said thyristor for increasing charge carrier recombination, said thyristor connected to said IGBT such that said first cell and said main cell form a lateral field effect transistor (FET) having a channel of a first conductivity type, said lateral FET having at least one trench formed therein and including an insulated gate electrode disposed in said at least one trench; and
   a second cell connected to said main cell and having a MOS switch, said second cell with said main cell together forming a FET with a channel of a second conductivity type.

2. A gate-controlled thyristor, comprising:
   a first cell having an insulated gate bi-polar transistor (IGBT);
   a main cell having a thyristor with an emitter zone and a layer embedded in said emitter zone of said thyristor for increasing charge carrier recombination, said thyristor connected to said IGBT such that said first cell and said main cell form a lateral field effect transistor (FET) having a channel of a first conductivity type, and said layer being made of a material selected from the group consisting of a metal and a silicide including aluminum and titanium silicide; and
   a second cell connected to said main cell and having a MOS switch, said second cell with said main cell together forming a FET with a channel of a second conductivity type.

3. The gate-controlled thyristor according to claim 1, wherein said FET has at least one trench formed therein and a gate electrode disposed in said at least one trench.

4. The gate-controlled thyristor according to claim 3, including an insulator layer disposed under at least one of said first cell and said second cell.

5. The gate-controlled thyristor according to claim 4, wherein said insulator layer extends below said main cell.

6. The gate-controlled thyristor according to claim 5, wherein said thyristor has a base layer with an opening formed therein.

7. The gate-controlled thyristor according to claim 6, including an n-conducting base zone grown epitaxially and having recombination centers disposed below said base layer.

8. The gate-controlled thyristor according to claim 7, wherein said n-conducting base zone has a region provided with said recombination centers.

9. The gate-controlled thyristor according to claim 8, wherein said recombination centers are formed from a material selected from the group consisting of gold, platinum, and crystal defects produced by irradiation.

10. The gate-controlled thyristor according to claim 7, including a semiconductor body with said main cell, said first cell and said second cell disposed in said semiconductor body, said semiconductor body having said recombination centers disposed entirely throughout said semiconductor body, and said recombination centers are formed from a material selected from the group consisting of gold, platinum, and crystal defects produced by irradiation.

11. The gate-controlled thyristor according to claim 7, including a semiconductor body with said main cell, said first cell and said second cell disposed in said semiconductor body, said semiconductor body having said recombination centers disposed partially throughout said semiconductor body, and said recombination centers are formed from a material selected from the group consisting of gold, platinum, and crystal defects produced by irradiation.

12. The gate-controlled thyristor according to claim 2, wherein said FET has at least one trench formed therein and a gate electrode disposed in said at least one trench.

13. The gate-controlled thyristor according to claim 12, including an insulator layer disposed under at least one of said first cell and said second cell.

14. The gate-controlled thyristor according to claim 13, wherein said insulator layer extends below said main cell.

15. The gate-controlled thyristor according to claim 14, wherein said thyristor has a base layer with an opening formed therein.

16. The gate-controlled thyristor according to claim 15, including an n-conducting base zone grown epitaxially and having recombination centers disposed below said base layer.

17. The gate-controlled thyristor according to claim 16, wherein said n-conducting base zone has a region provided with said recombination centers.

18. The gate-controlled thyristor according to claim 17, wherein said recombination centers are formed from a material selected from the group consisting of gold, platinum, and crystal defects produced by irradiation.

19. The gate-controlled thyristor according to claim 18, including a semiconductor body with said main cell, said first cell and said second cell disposed in said semiconductor body, said semiconductor body having said recombination centers disposed entirely throughout said semiconductor body, and said recombination centers being formed from a material selected from the group consisting of gold, platinum, and crystal defects produced by irradiation.

20. The gate-controlled thyristor according to claim 17, including a semiconductor body with said main cell, said first cell and said second cell disposed in said semiconductor body, said semiconductor body having said recombination centers disposed partially throughout said semiconductor body, and said recombination centers being formed from a material selected from the group consisting of gold, platinum, and crystal defects produced by irradiation.

* * * * *